United States Patent [19]

Davis et al.

[11] Patent Number: 5,116,433
[45] Date of Patent: May 26, 1992

[54] SOLDER PASTE HAVING SOLDER ALLOY/FORMATE COMPLEXES AS OXIDE SCAVENGERS, AND METHOD FOR PREPARING SAME

[75] Inventors: James L. Davis, Tamarac; Fadia Nounou, Plantation; Anthony B. Suppelsa, Coral Springs; Robert W. Pennisi, Boca Raton, all of Fla.

[73] Assignee: Motorola, Inc., Schaumburg, Ill.

[21] Appl. No.: 607,387

[22] Filed: Oct. 31, 1990

[51] Int. Cl.⁵ .............................................. B23K 35/34
[52] U.S. Cl. ........................................ 148/24; 148/23; 148/25
[58] Field of Search ..................................... 148/23-25

[56] References Cited

U.S. PATENT DOCUMENTS

| | | |
|---|---|---|
| 2,898,255 | 8/1959 | Thompson .............................. 148/23 |
| 3,925,112 | 12/1975 | Petersen, Sr. et al. |
| 4,495,007 | 1/1985 | Zado ...................................... 148/23 |
| 4,567,111 | 1/1986 | Janikowski et al. ................. 428/457 |
| 4,715,894 | 12/1987 | Holzman et al. ................... 106/1.25 |
| 4,803,147 | 2/1989 | Meuller et al. ...................... 430/288 |
| 4,816,070 | 3/1989 | Holtzman et al. .................. 106/122 |
| 4,882,202 | 11/1989 | Holtzman et al. .................... 427/98 |

Primary Examiner—Peter D. Rosenberg
Attorney, Agent, or Firm—Dale W. Dorinski; Daniel K. Nichols

[57] ABSTRACT

A solder paste is formulated by combining a solder paste vehicle, a resin, and solder alloy particles. The solder paste vehicle is made by combining mono and polyfunctional alcoholic solvents with a fluxing agent. The solder particles are first reacted with a formate ion produced by formic acid, formaldehyde, paraformaldehyde, or mixtures thereof, in order to create a metal-formate complex that functions as an oxygen scavenger on the surface of the solder alloy particles.

21 Claims, No Drawings

SOLDER PASTE HAVING SOLDER ALLOY/FORMATE COMPLEXES AS OXIDE SCAVENGERS, AND METHOD FOR PREPARING SAME

Cross-Reference to Related Applications

This application is related to U.S. patent application Ser. No. 07/521,871 filed on May 11, 1990 which relates to solder paste formulations containing alcohol blends and is related to U.S. patent application Ser. No. 07/583,630 filed on Sep. 17, 1990 which relates to solder paste formulations that produce a residue that is cleanable with formic acid.

BACKGROUND OF THE INVENTION

1. Field of the Invention

This invention relates to a composition of matter, a method for preparation of said composition, the use of the composition in a process of manufacture and the resultant article of manufacture. More specifically, this invention is directed to an improved solder paste formulation incorporating an organo-metallic formate complex, the method for the preparation of the solder paste incorporating such complexes, the use of the improved solder paste formulation in a soldering operation, and the printed circuit board manufactured with the improved solder paste of this invention.

2. Description of the Prior Art

The formulation of solder paste for use in electronics manufacture is a highly empirical art. A typical solder paste will typically contain at least three functional components: a solder alloy, a flux, and a vehicle (generally a polymer resin, within which the solder alloy and flux are contained). There are reportedly more than fifty (50) variables affecting solder paste performance; See Hwang, J. S. et al., "The Complex Concoction", Circuits Manufacturing, pages 73–78 (December 1987). Reportedly, this complexity is not merely the result of the number of variables or parameters, but, rather, the interaction of these variables or parameters with one another. Further complicating the formulation process are the variables which are introduced by paste handling and the re-flow process.

For example, the science of metallurgy will determine the selection of a solder alloy based upon proper solderability and joint integrity. Particle technology will dictate the physical characteristics of the alloy powder for desired dispensing and printing properties. The composition of the alloy powder also affects a paste's ability to solder within a given vehicle and flux system.

Chemistry fosters a better understanding of the chemical properties of the paste, such as the reactivity of the solder powder and the substrate, upon which it is applied, its reactivity at operating temperatures (this affects solderability), residue characteristics and joint integrity. This understanding must also extend to surface and interface phenomenon, as well as physical and thermal properties of individual chemicals and of the whole system. These factors have a significant effect on the paste solderability and residue properties. From a rheological standpoint, a material like solder paste is normally treated as a visco-elastic solid. Therefore, its flow properties under shear rates become necessary rheological information to predict its behavior in the environment of contemplated use. For example, a paste characterized by low thixotropy and yield point demonstrates good fine dot dispensability. In addition, elasticity and time effect on flow, as dynamically tested, are also useful to understanding rheology, hence the behavior of the paste. Flow behavior and elasticity can be used as fingerprints to control paste quality and batch to batch consistency.

In order for a solder paste to work effectively, that is, to form an electrically acceptable pattern on a circuit board, the surface interface between the solder and the substrate to which it is applied must be clean (i.e., free of residues, such as dirt, grease, and oxides). The flux components of the solder paste functions to remove/displace surface contaminates from both the solder alloy (solder balls) and the circuit board substrate, to insure that the solder wets the substrate surface at re-flow. The solder flux also functions to assist in heat transfer between the surfaces to be joined during the re-flow process. Generally, the flux performs its cleaning function by chemical/scavenging interaction of surface contaminants.

In practice, the flux, once having performed its function, must be removed; that is, the residues which remain from the flux must be removed in order to avoid corrosion of the surfaces upon which such residues remain. A number of fluxes require activators in order to operate properly at re-flow. One of the components (activators) of the flux, which can contribute to corrosion is halide (i.e. chloride salts). The relative acidity of different fluxes has been reported in the literature, see, for example, Jeanie S. Hwang, Solder Pastes in Electronics Packaging, Van Nostrand Reinhold, New York (1989).

The main contaminants to be removed by fluxes are the reaction products of the base metals (printed circuit board substrates) with air (ie. oxides, hydroxides, and sulfides). This is typically achieved during the re-flow process wherein the flux combines with the various contaminants and/or affects their displacement in order to ensure the good wettability of the solder and the substrate of the printed circuit board. Where the flux and/or contaminants are not volatilized completely, residues remain on the circuit board which can detract from the performance (electrical) of the circuit board or otherwise adversely affect the durability of the circuit board over time. In order to avoid these problems associated with the flux residues and other contaminants remaining after re-flow, the resultant circuit board is washed with organic solvents such as the chloroflorocarbons and othe similar environmentally offensive materials.

The "solder cream" formulation, described in UK Patent 2,198,676, is representative of the efforts to eliminate solder residues and thus obviate the need for a separate cleaning step employing the relatively offensive agents referred to hereinabove. This patent achieves its objectives through the incorporation into the solder cream of one or more of the following aliphatic carboxylic acids (propionic acid, oxalic acid, adipic acid, malic acid, maleic acid and citric acid and aromatic carboxylic acids, for example, salicylic acid). While formulations, such as that described in the above patent, have been proven to some extent to be efficacious, improvement still is required to the effect the requisite degree of cleanliness demanded in precise and exacting electronics applications. Thus, the need continues to exist for a solder paste which is both compatible with screen printing manufacture of printed circuit boards and yet provides the requisite properties to ensure that minimal residue will remain on the printed circuit board subsequent to re-flow and thereby preserve the electrical integrity of the circuit board and its long term durability.

OBJECTIVE OF THE INVENTION

It is the principle object of this invention to remedy the above as well as related deficiencies in the prior art, notably the prior art relating to solder paste compositions.

More specifically, it is the object of this invention to provide a means and method for manufacture of printed circuit boards (hereinafter "PCB"), which is devoid of the problems associated with removal of solder paste residues and thereby provides for simplified manufacture of PCB's.

It is another object of this invention to provide a solder paste composition having oxygen scavengers for the removal of oxygen from the surface of the solder.

It is yet another object of this invention to provide an improved solder paste formulation containing metal formate complexes to reduce oxide content of the metal surface and to provide a source of formate ions for oxygen scavenging.

It is still yet another object of this invention to provide an improved solder paste formulation prepared by simple and inexpensive manufacturing techniques.

Further objects of this invention include the use of the unique solder paste formulations of this invention in an improved method of manufacture of PCB's.

SUMMARY OF THE INVENTION

The above and related objects are achieved by providing a formulation comprising a solder paste, wherein metal component thereof has been partially reacted with a source of formate ion to produce a solder surface coating/deposit of metal formate complex. The relative proportions of metal formate on the solder surface, is effective, in use, to serve as an oxygen scavenger at the solder/PCB interface. The chemical interaction of the formate ion with the metal oxide (which is generally present) on the solder surface replaces the metal oxide with the metal formate. In the preferred embodiments of this invention, preformed solder spheres are initially cleaned and thereafter exposed to a source of formic acid, either in the liquid or gaseous phase. The source of formic acid can be formic acid itself, formaldehyde or paraformaldehyde, or mixtures thereof. The interaction of the formic acid with the solder alloy occurs readily (in the liquid phase at both room temperature and at elevated temperatures; in the gaseous phase at temperatures sufficient to vaporize formic acid and or formaldehyde); or by simply refluxing the solder spheres in a closed system with a source of formic acid near the boiling point of formic acid (approximately 100 degrees C.). The objectives of this treatment are to chemically react formate ions with the surface of the solder alloy spheres and thereby impart an effective amount of metal formate complex to the surface of these alloy spheres in order to achieve, upon reflow, sufficient scavenging of oxygen from the surface of the circuit board to assure efficient wetting of the surface of the circuit board with the solder and good adhesion thereto. In the most preferred embodiments of this invention the solder alloy will contain in excess of sixty (60) weight percent tin, and have a particle size of less than 0.044 mm. In a typical solder paste composition, the paste will contain about 75-90% solder alloy, 5-10% flux with the remainder being solvents and additives. The resultant solder paste is preferably applied to the circuit board substrate via a screen printing technique utilizing a squeegee and a mask. The generation of metal formate complex via the process of this invention is also applicable to enhancement in the oxygen scavenging properties of solder spheres and other metal alloy based solder compositions having varying alloy ratios.

In the use, the metal formate on the surface of the solder spheres interacts with the oxygen on the surface of the circuit board producing a fugitive compound which vaporizes during the reflow process.

DESCRIPTION OF THE INVENTION INCLUDING PREFERRED EMBODIMENTS

The unique formulations and methods of manufacture of surface mount assemblies are achieved (in accordance with the inventions described herein) by initially providing a metal based solder alloy (in the form of solder spheres) and reacting the solder alloy with formic acid, formaldehyde, or paraformaldehyde (or mixtures thereof) under the appropriate conditions. This can be achieved by initially cleaning the alloy in the appropriate solvent (i.e., acetone) to remove any grease or organic residues. Following the cleaning of the solder alloy, it is rinsed with deionized water utilizing ultrasonic agitation. Following initial cleaning, the solder alloy is placed in a beaker and covered with formic acid (or equivalent solution). Subsequent thereto the beaker and its contents are preferably heated for one to two hours at slightly below the boiling point of the solution. Alternatively, the solder alloy and formic acid can be heated under reflux conditions, thereby insuring recovery of any volatile compounds and thus preventing their escape into the atmosphere.

Following interaction of the solder alloy spheres and formate ion in the above manner, the treated solder spheres are drained of any excess fluid under an oxygen-free environment, and dried. The treated solder spheres are preferably maintained in an oxygen-free environment until formulation into a solder paste with standard vehicles.

The solder paste formulations of this invention include, in addition to the solder alloy, essentially three (3) ingredients, notably, a resin, a flux, and other additives, which are "dissolved/suspended" in a suitable solvent. The resin component of the solder paste can comprise a suitable polymer/oligomer to provide the proper tack and rheological characteristics suitable in screen printing techniques. The chemical and physical characteristics of a solder paste are well-documented in technical literature see, for example, Hwang, J. S., Chapter 3, entitled "Chemical and Physical Characteristics", *Solder Paste and Electronics Packaging* (Van Nostrand Reinhold Publishers, New York City). As is appreciated, each of the ingredients in the paste provides a necessary function, such as a bonding agent, fluxing agent, rheology control, suspending agent and possibly a specific function modifier. Each ingredient is interrelated to the other with respect to performance of the paste and failure to anticipate or appreciate these relationships can significantly and adversely affect paste performance. The relative crystallinity of the polymer can also affect its softening temperature and its glass transition temperature. Polymeric materials which are suitable for use in the paste of this invention include polymers derived from cyclohexane and polymers derived from di-isobutylene.

The fluxes which are suitable for use in the solder paste composition in this invention include rosin and other suitable low residue fluxes.

Typically, solder paste vehicles include solvents suitable for dissolving fluxes and activators or other additives needed to achieve the proper rheological properties required for screen printing. Currently, cyclohexanol derivatives or various mono- and dialkyal ethers of ethylene glycol and derivatives thereof, for example, Cellosolve TM, are used in commercial solder pastes. In the preferred embodiments of this invention, the preferred solder paste vehicle is a blend of mono-alcohols and poly-alcohols, the relative concentration of which can be readily tailored to meet the exacting rheological properties necessary for screen printing environment. These alcohols also serve as a suitable solvent for organic acid fluxing agents or activators and thickening agents which are required to tailor the rheological properties of the paste to the screen printing environment.

For optimum performance of the solder paste, the alcohols selected as the vehicles for use in the formulations of this invention should exhibit a boiling point between 150 and 350 degrees C. and most preferably about 175-275 degrees C. Low boiling point alcohols generally evaporate prior to re-flow causing the paste to dry out prematurely. In contrast, the higher boiling alcohols are not evaporated fully upon re-flow and thus tend to leave behind undesirable residues which must be removed from the printed circuit board. The alcohols which are preferably used in the formulations of this invention exhibit very low vapor pressures at room temperature, thus resulting in little or no solvent evaporation in the eminent environment.

It has been found that the best results are achieved when lower viscosity primary alcohols and substituted alcohols are blended with polyfunctional alcohols such as di-alcohols and tri-alcohols. In one aspect, the viscosity of mono-alcohols used in the vehicle blend should be at least 3 centipoise at room temperature, and in the more preferred aspects of this invention, about 3 to about 20 centipoise. The viscosity of high viscosity polyfunctional alcohol thickeners in one aspect of this invention can range from about 26 to about 1500 centipoise at room temperature and most preferably from about 30 to 1000 centipoise at room temperature.

More specifically, the low viscosity, mono-functional alcohol solvents have one hydroxyl group and from about 1 to about 18 carbon atoms, and are within the viscosity ranges noted above. Examples of such monoalcohols include, but are not limited to methanol, ethanol, 2-propanol, 2-butanol, 1-hexanol, 1-heptanol, 1-octanol, 1-nonanol, 1-dodecanol, 2-ethoxyethanol, 2-(2-ethoxyethoxy)ethanol, 2-(2-butoxyethoxy)ethanol n-hexadecanol, n-octadecanol, benzyl alcohol and mixtures thereof.

The high viscosity polyfunctional alcohol thickeners have at least two hydroxyl groups and may have from about 2 to about 16 carbon atoms. Suitable polyalcohols include, but are not limited to, 1,2-ethanediol (also known as ethylene glycol); 1,2-propanediol (propylene glycol); 1,3-propanediol; 1,2-butanediol; 1,3-butanediol; 1,4-butanediol; 1,2-pentanediol; 1,5-pentanediol; 2,4-pentanediol; 2,5-hexanediol; glycerol (also known as glycerin or 1,2,3-propanetriol); 1,2,4-butanetriol; 2,2-(ethylenedioxy)diethanol; 1,12-dodecanediol; 1,16-hexanedecanediol and mixtures thereof.

In one aspect, the low viscosity, mono-functional alcohol solvent forms the major portion or greater than 50 wt. % of the alcohol blend, and the high viscosity polyfunctional alcohol thickener comprises a minor portion or less than 50 wt. % of the alcohol blend. In a preferred embodiment, the mono-alcohol component ranges from about 75 to about 90 wt. %. While it is permitted to add additional thickeners to the system of this invention, and perhaps preferred in some situations, in most cases it is anticipated that no additional thickener need be used beyond the high viscosity polyfunctional alcohol thickeners. The proportions of the two alcohols can be adjusted to give the desired rheological properties in the majority of applications.

Other vehicle additives, such as surfactants, odorants, bactericides, fungicides, anti-foam agents, etc., may be added as desired with no deleterious effects.

The examples which follow illustrate a number of the preferred embodiments of this invention. Parts and percentages appearing in such examples are by weight, unless otherwise indicated. Similarly, common procedures and equipment used in such procedures, where specified herein, are presumed to be in accord with conventional art recognized techniques unless indicated to the contrary.

The present invention will be further illustrated with respect to the following detailed, non-limiting examples. Solder pastes were formulated using the solvents described above. These pastes exhibited acceptable rheological properties, resulting in good screen print definition. The composition of the paste varied from 88-92 wt. % solder powder and 5-12 wt. % alcohol blends. The remainder was organic acids added as fluxes and activators.

EXAMPLES

Preparations of Metal Formate Solder Alloy

For the purposes of these Examples, the solder alloy can have either of two particle sizes and the following compositions:

Composition #1: 63% Sn and 37% Pb
Composition #2 62% Sn, 36% Pb and 2% Ag
Composition #3 63% Sn, 36.5% Pb and 0.35% Sb

Paste Grade Solder

Solder particles, such as spheres or other irregular shapes, useful in solder paste of this invention, are of approximately 0.044 mm (or less) in diameter and of the same alloy composition as #'s 1, 2 and 3 (above) and further contain the following ingredients in the relative proportions set forth below:

Solder Paste Formulations 75-85% paste grade solder alloy;
5-10% fluxes (generally rosin);
5-20% solvent and other conventional solder paste additives.

EXAMPLES 1-6

Solder spheres (of each of the composition and particle size set forth above) are separately processed in six (6) individual reactors. In each instance, the solder spheres are precleaned by soaking in reagent grade acetone for about twenty (20) minutes, followed by a five (5) minute ultrasonic bath in distilled deionized water. Following the initial cleaning of the solder spheres in the above manner, the solder spheres are placed in an open beaker, covered with formic acid (ACS reagent grade, 96%, available from Aldrich Chemical Company) and allowed to stand at room temperature for about two (2) hours. Subsequent thereto, the formic acid is drained from the beaker, under nitrogen, and the solder spheres are dried in a nitrogen environment. The solder spheres treated in the above manner can be stored in an oxygen free environment for future use; or formulated (in the case of paste grade solder) with fluxes, solvents and appropriate additives in any of the relative proportions set forth above.

The presence of surface formates was verified by X-ray photoelectron spectroscopy (XPS), Fourier Transform Infrared spectroscopy (FTIR), and Scanning Electron Microscopy (SEM).

EXAMPLE 7-12

The procedures of Examples 1-6 are hereinafter repeated except that the interaction of the solder spheres with the formic acid is performed at elevated temperatures (~100 degrees C.) for 1-2 hours. The results obtained herein are comparable to those obtained in Examples 1-6, with the formation of surface formates apparently going to completion more rapidly and the surface interaction appearing more complete at elevated temperatures.

EXAMPLES 13-18

The procedures of Examples 7-12 are repeated except for the heating of the solder spheres with formic acid under reflux conditions.

EXAMPLES 19-24

The procedures of Examples 13-18 are herein repeated expect that the solder alloy is initially cleaned, combined with rosin flux and paraformaldehyde in an alcohol blend containing a major amount of a mono functional alcohol and a minor amount of a poly functional alcohol (relative proportions are 90:10). To this formulation is added about 2-3 wt % paraformaldehyde, a concentration sufficient to provide adequate chemical interaction with the alloy to produce sufficient quantities of formate complexes to enable scavenging of oxides from the solder spheres and at the printed circuit board surface under re-flow conditions. Paraformaldehyde is initially combined/dissolved in isopropanol, dodecanol, or other suitable solvent, prior to being combined with the other components of the solder paste.

The method of formate coating may also be used to prepare large solder spheres or preforms, for use in operations where solder paste is not applicable. Examples of such applications including bumping of chip carriers or integrated circuit die, as in the controlled collapse method disclosed in U.S. Pat. No. 4,558,812. Solder preforms are application-specific solder masses shaped to be individually applied in selected areas of a circuit board. The adbantages of using metal-formate coated solder spheres for bumping, or metal-formate coated solder preforms will be obvious to one with ordinary skill in the art of soldering.

What is claimed is:

1. A solder paste formulation consisting essentially of:
    a solder paste vehicle comprising:
        a solvent; and
        a fluxing agent;
    a resin; and
    solder alloy particles, having on the surface thereof, an oxygen scavenger comprising the reaction product of the solder alloy particles and formate ion, and said solder paste formulation excluding formic acid.

2. The solder paste of claim 1, wherein the solder alloy comprises metals selected from the group consisting of lead, tin, antimony, bismuth, indium, silver, and mixtures thereof.

3. The solder paste of claim 1, wherein the solder particles comprise an alloy of tin and lead.

4. The solder paste of claim 1, wherein the oxygen scavenger is the reaction product of the solder alloy and a compound selected from the group consisting of formic acid, formaldehyde, paraformaldehyde, and mixtures thereof.

5. The solder paste of claim 1, wherein the solvent comprises one or more mono-functional alcohols having one hydroxyl group and from 1 to about 18 carbon atoms, and one or more poly-functional alcohols having at least two hydroxyl groups and from about 2 to about 16 carbon atoms.

6. A solder paste formulation consisting of:
    a solder paste vehicle comprising:
        a solvent; and
        a fluxing agent;
    a resin; and
    solder alloy particles comprising;
        a solder alloy comprising about 60 to 65 weight % tin and about 35 to about 40 weight % lead; and
        an oxygen scavenger comprising the reaction product of the solder alloy particles and formic acid, the oxygen scavenger residing on the surface thereof.

7. A method of treating a solder alloy suitable for use in a soldering operation comprising exposing the solder alloy to a source of formate ions.

8. The method of claim 7, wherein the source for formate ions is a compound selected from the group consisting of formic acid, formaldehyde, paraformaldehyde, and mixtures thereof.

9. The method of claim 7, wherein the solder alloy is exposed to vapors of the formate ions.

10. The method of claim 7, wherein the solder alloy is exposed to a liquid solution of the formate ions.

11. The method of claim 7, wherein the solder alloy is exposed to the formate ion at ambient temperature and pressure.

12. The method of claim 7, wherein the solder alloy is exposed to the formate ion at elevated temperature and ambient pressure.

13. The method of claim 7, wherein the solder alloy comprises spheres or irregularly shaped particles suitable for use in a solder paste.

14. The method of claim 7, wherein the solder alloy comprises a solder preform.

15. The method of claim 7, wherein the solder alloy comprises a solder sphere suitable for bumping a chip carrier or similar electronic component.

16. The method of claim 7, wherein the solder alloy is selected from the group consisting of lead, tin, antimony, bismuth, indium, silver, and mixtures thereof.

17. The method of claim 7, wherein the solder alloy comprises an alloy of tin and lead.

18. A method of joining two or more metal surfaces, wherein the metals are metallurgically joined by alloying with a solder having an oxygen scavenger, the scavenger comprising the reaction product of the solder alloy particles and formate ion.

19. The method of claim 18, wherein the oxygen scavenger is the reaction product of the solder and a compound selected from the group consisting of formic acid, formaldehyde, paraformaldehyde, or mixtures thereof.

20. The method of claim 18, wherein the objects comprise electrical components, substrates, or assemblies.

21. The method of claim 18, wherein the electrical components, substrates or assemblies comprise a radio.

* * * * *